United States Patent [19]
Holzmann et al.

[11] Patent Number: 5,933,370
[45] Date of Patent: Aug. 3, 1999

[54] TRIMBIT CIRCUIT FOR FLASH MEMORY

[75] Inventors: Peter Holzmann, Campbell; James Brennan, Jr., Saratoga; Anthony Dunne, Cupertino; Hieu Van Tran, San Jose, all of Calif.

[73] Assignee: Information Storage Devices, Inc., San Jose, Calif.

[21] Appl. No.: 09/005,074

[22] Filed: Jan. 9, 1998

[51] Int. Cl.⁶ .................................................. G11C 16/04
[52] U.S. Cl. .............................. 365/189.05; 365/225.7; 365/189.12
[58] Field of Search ........................ 365/189.05, 225.7, 365/189.12, 200

[56] References Cited

U.S. PATENT DOCUMENTS

| | | |
|---|---|---|
| 4,538,245 | 8/1985 | Smarandoiu et al. . |
| 4,617,651 | 10/1986 | Ip et al. . |
| 5,148,395 | 9/1992 | Sowards . |
| 5,243,239 | 9/1993 | Khan et al. . |
| 5,262,994 | 11/1993 | McClure ............................. 365/200 |
| 5,352,934 | 10/1994 | Khan . |
| 5,430,687 | 7/1995 | Hung et al. ..................... 365/230.08 |
| 5,623,436 | 4/1997 | Sowards et al. . |
| 5,642,316 | 6/1997 | Tran et al. . |
| 5,793,674 | 8/1998 | Kubo et al. ...................... 365/185.09 |

OTHER PUBLICATIONS

"SST Data Book", Silicon Storage Technology, Inc., pp. 17.1–17.7 (May 1995).

*Primary Examiner*—David Nelms
*Assistant Examiner*—VanThu Nguyen
*Attorney, Agent, or Firm*—Blakely, Sokoloff, Taylor & Zafman LLP

[57] ABSTRACT

A trimbit circuit for flash memory integrated circuits is described. The trimbit circuit is used to store the addresses of bad rows and/or columns in flash memory arrays. Furthermore the trimbit circuit is used to store the trimbits for trimable circuits in the integrated circuit, i.e. voltage references, precision oscillator, etc. The invention includes a row of flash memory trimcells and a trimcell differential amplifier circuit. The trimcell differential amplifier circuit can serially shift in trimbits into a latch and serially shift out trimbits without having to program the flash memory trimcells. The final settings of the trimbits can be programmed by means of a high voltage buffer. A non-overlapping clock generator and additional logic is also included to control the circuit.

13 Claims, 9 Drawing Sheets

TRIMBIT CIRCUIT FOR FLASH MEMORY

BACKGROUND OF THE INVENTION

1. Field of the Invention

The present invention relates generally to the field of integrated circuits, and specifically, to fuse circuits used to increase the production yield of flash memory integrated circuits.

2. Background Information

Particle defects due to fabrication environments can cause flash memory integrated circuits, especially those with high density memory arrays, to fail. As a result, a yield loss in production test is realized, thereby causing the final satisfactory product to cost substantially more in order to cover the cost of the faulty parts. To help increase production yield, a technique, commonly known as redundancy repair (row, column, or block), is used to avoid use of the failed memory portion in favor of a corresponding redundant memory portion included on the integrated circuit just for such purposes.

Redundancy circuits typically store the addresses of the failed memory portion by using fuse circuits which compare the incoming addresses versus the stored redundancy addresses for a match. If a match is found, the redundancy array is enabled and the main array is disabled. An enable fuse is typically included to enable or disable the redundancy addresses.

In addition to the storage of redundancy addresses, the fuse circuit can be used to store the settings for other circuits, such as voltage references, precision oscillators, etc. At production test, these circuits can be trimmed by the fuse circuit in order to increase the production yield. In one embodiment, fuse circuits are referred to as trim circuits and flash memory fuses are referred to as flash memory trimcells.

Some conventional implementations use a resistor fuse as a programmable element to store the failed addresses. The fuse is blown by applying a high current through the fuse by a test enabling circuit. However, such a fuse is one-time programmable only. Since the current required to blow the fuse is usually high, the transfer switch has to be large, and requires a correspondingly large chip area.

Other implementations use erasable programmable read-only memory ("EPROM") technology. However, as implemented, an EPROM fuse is also one-time programmable. Furthermore, an EPROM requires complicated shielding over the fuse after programming in order to retain the programming charge.

In yet other implementations, an electrically erasable programmable read only memory ("EEPROM") is used in an inverter mode (as commonly known), i.e., the cell in the read mode acts as a current sink for some loading elements such as a PMOS, NMOS, or a resistor. The device gate is typically held at 2 V and its source at ground, with its drain coupled to the load. The voltage at the loading element is the output of the memory cell.

Conventional methods of generating trim bits are by placing the EEPROM cells on an area away from the array. Reading and programming is done in parallel. However, the problem with this method is that the EEPROM cells will not properly match the cells in the array. Also, the parallel read and programming modes require extensive circuits when large trimbit quantities are used.

In prior art U.S. Pat. No. 4,617,651 by W. Ip and G. Perlegos and U.S. Pat. No. 4,538,245 by G. Smarandolu and G. Perlegos, the fuse element is a one time programmable fuse as opposed to the many times programmable flash memory fuse of the present invention. The flash memory fuse enables the redundancy and trimable circuits to be programmable many times and does not require high currents to drive the fuse. Furthermore, in '651 and '245 patents, the programming of the fuse elements is done in parallel in contrast to the serial loading and programming of the present invention. The serial loading saves a considerable amount of space, especially when large trimbit quantities are used.

In prior art U.S. Pat. No. 5,148,395 by David Sowards, EEPROM fuses are stand alone and outside of the array. Additionally, large support circuits are required to operate it.

In prior art U.S. Pat. No. 5,642,316 by Hieu Van Tran and Trevor Blyth, the EEPROM fuses are programmed by the same column drivers as the main array. Therefore, a column redundancy scheme is not allowed. Also, the EEPROM fuses first have to be programmed in order to use the trimbits for characterization of the performance of the integrated circuit. This is not the case in the present invention, since the trimbits can be serially loaded in a latch where they are stored and used for characterization of the integrated circuit. Also, programming, erasing, and reading of the flash memory fuses is done by means of separate drivers. Therefore, a column redundancy scheme is allowed. The flash memory fuses are embedded in the array and thus match the flash memory cells in the array.

SUMMARY OF THE INVENTION

The present invention is a trimbit circuit that includes a row of flash memory trimcells. The flash memory trimcells are lined up with and placed near the flash memory array in order to match the flash memory array cells. They are surrounded by dummy rows and columns of trimcells as a barrier and to match the flash memory array cells. Each pair of flash memory trimcells is coupled to a trimcell differential amplifier circuit which provides a trimbit. Thus, a pair of flash memory trimcells and a trimcell differential amplifier circuit is referred to as a fuse. The trimbit circuit is designed to read, program, and erase the flash memory trimcells. These operations do not interact with the reading, programming, or erasing of the flash memory array. The trimbit circuit also features serial loading and unloading of trimbits for programming and reading. Therefore, the serial loading can also be used to control the trimbits without having to program the flash memory trimcells. This will result in a reduction of test and characterization time in the production and test phase of the integrated circuit.

BRIEF DESCRIPTION OF THE DRAWINGS

The features and advantages of the present invention will become apparent from the following detailed description of the present invention in which.

DESCRIPTION OF THE PREFERRED EMBODIMENT

An apparatus and method for a flash memory trimbit circuit, used in a flash memory device to increase the production yield, is described in detail. The flash memory device is described in co-pending U.S. patent application entitled "A Recording and Playback Integrated System for Analog Non-Volatile Flash Memory", by James Brennan, Jr. et al., application Ser. No. 09/004,798, filed concurrently herewith and assigned to the assignee of the present invention. It is to be appreciated that the present invention may used with other storage systems such as digital storage systems. The operation of an exemplary flash memory cell can be found in the datasheet entitled "SuperFlash EEPROM Technology", SST DATA BOOK, page 17.1–17.7 (May 1995).

Figure 1A:
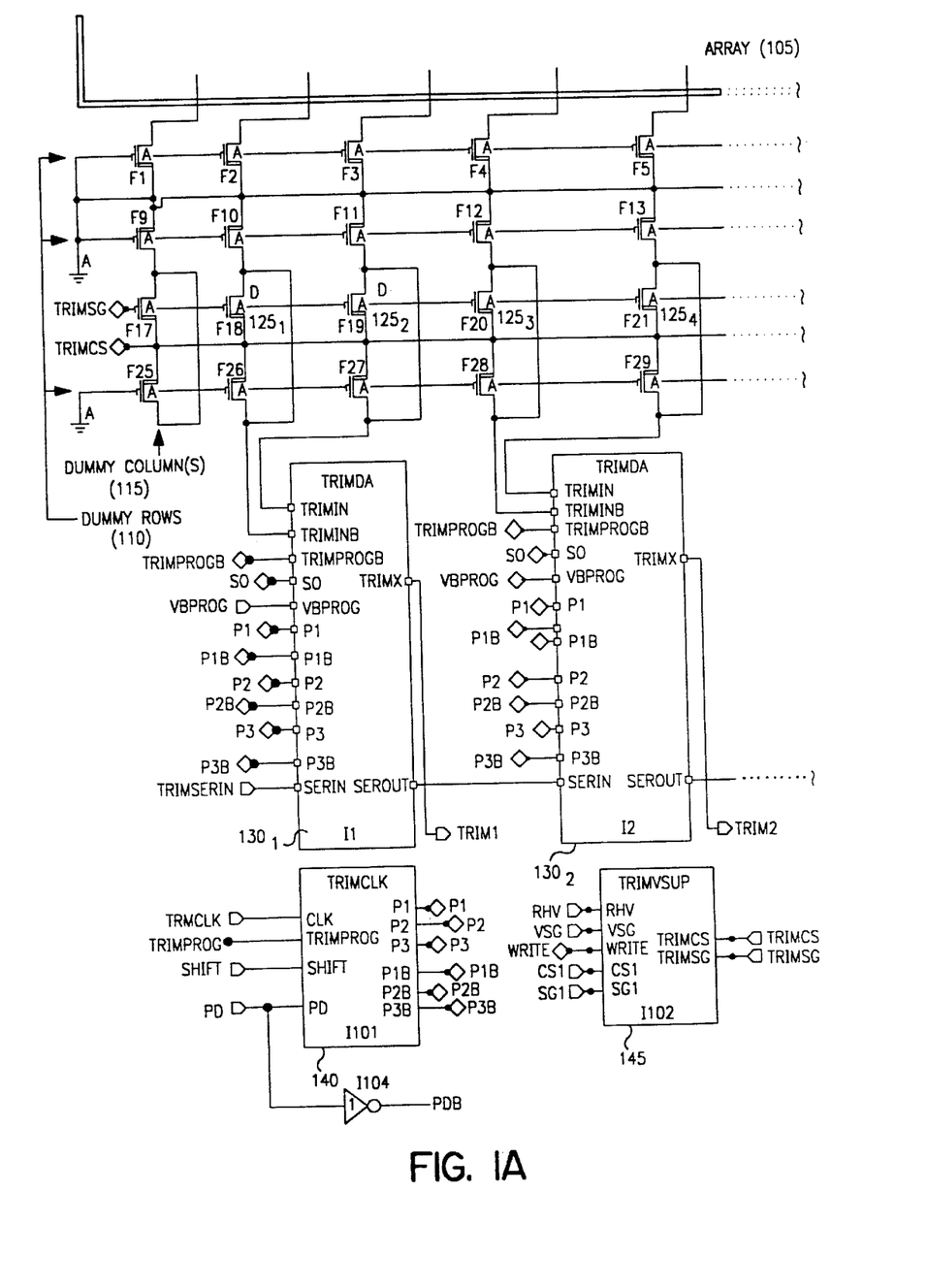
FIG. 1 is a block diagram illustrating a preferred embodiment of a trimbit circuit.
Figure 1B:
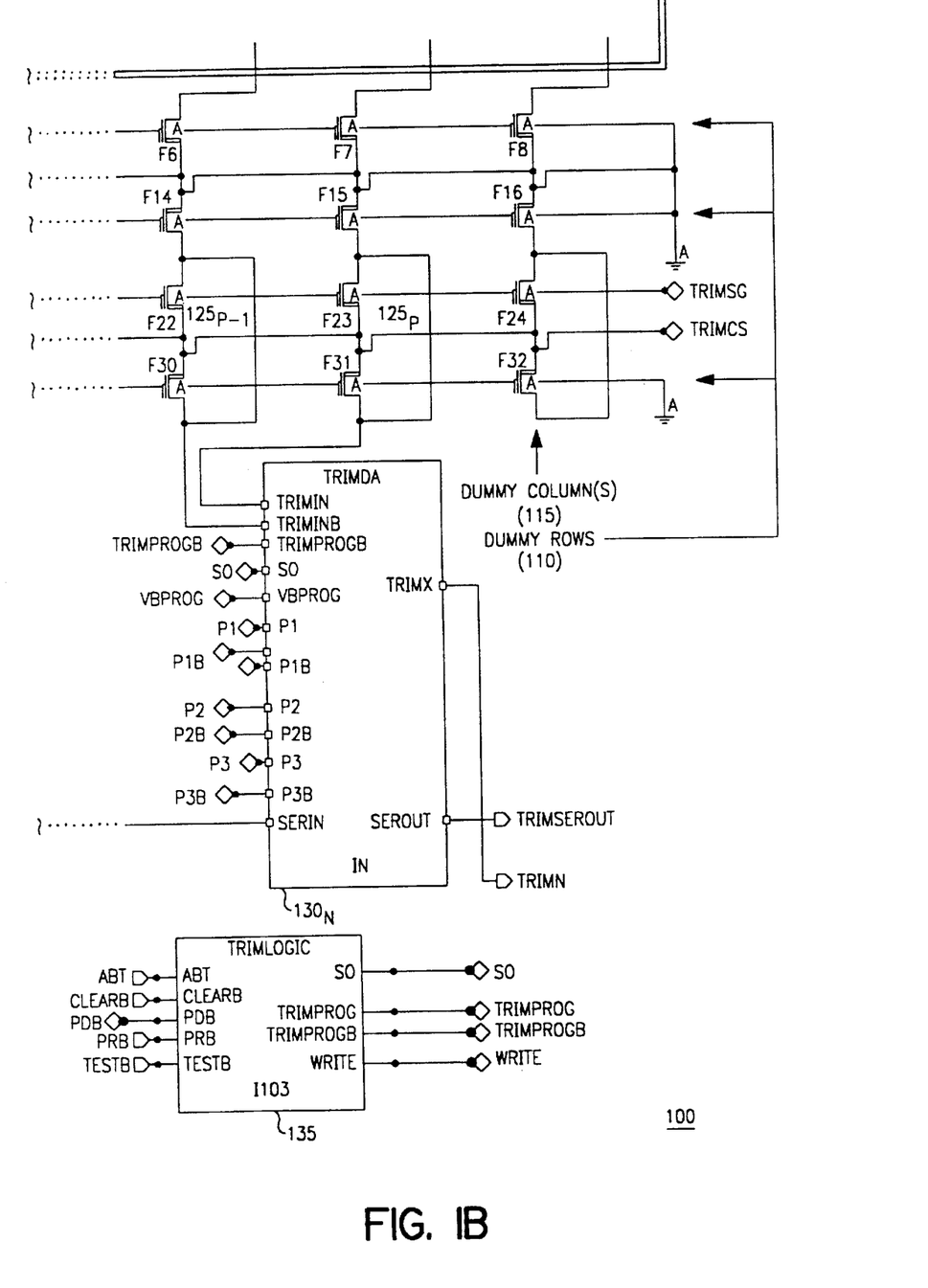

FIG. 1 is a block diagram illustrating a preferred embodiment of a trimbit circuit 100. Referring to FIG. 1, the trimbit circuit 100 includes a main array 105 having (2*N+2) columns and (M+3) rows of memory cells, where N and M are positive whole numbers. The main array 105 includes dummy rows 110 (e.g., three) and dummy columns 115 (e.g., two), typically located at the bottom of the main array 105. In between the dummy rows and columns is a row of flash memory trimcells $125_1$–$125_P$ (where P is a positive whole number). Each pair of adjacent trimcells (e.g., $125_1$ and $125_2$, $125_3$ and $125_4$, ..., $125_{P-1}$ and $125_P$) is coupled to a corresponding trimcell differential amplifier circuit $130_1$–$130_N$. Each trimcell differential amplifier circuit $130_1$–$130_N$ includes a serial input terminal SERIN and a serial output terminal SEROUT. A terminal TRIMSERIN is coupled to the serial input terminal SERIN of the first trimcell differential amplifier circuit $130_1$ and the serial output terminal SEROUT of each trimcell differential amplifier circuit $130_1$–$130_{N-1}$ is coupled to a next successive trimcell differential amplifier circuit $130_2$–$130_N$ (i.e., in a daisy chain fashion).

In the discussion that follows, for sake of clarity, reference is made to the flash memory trimcells (or trimcell pair) $125_1$ and $125_2$ and trimcell differential amplifier circuit $130_1$. However, the description is equally applicable to the other corresponding flash memory trimcell pairs and trimcell differential amplifier circuits (i.e., trimcells $125_3$ and $125_4$ and trimcell differential amplifier circuit $130_2$, ..., trimcells $125_{P-1}$ and $125_P$ and trimcell differential amplifier circuit $130_N$).

The trimbit circuit 100 of the present invention includes four main modes of operation, namely, Read, Program, Erase, and Shift. The signals for the first three modes of operation are generated by a TRIMLOGIC circuit 135 (see FIG. 3). The signals for the Shift mode of operation are generated by a TRIMCLK circuit 140 (see FIG. 4). A TRIMVSUP circuit 145 provides a select gate voltage TRIMSG and a common source voltage TRIMCS to the row of flash memory trimcells $125_1$–$125_P$ (see FIG. 5). The various blocks in FIG. 1 will now be described in more detail.

Figure 2:
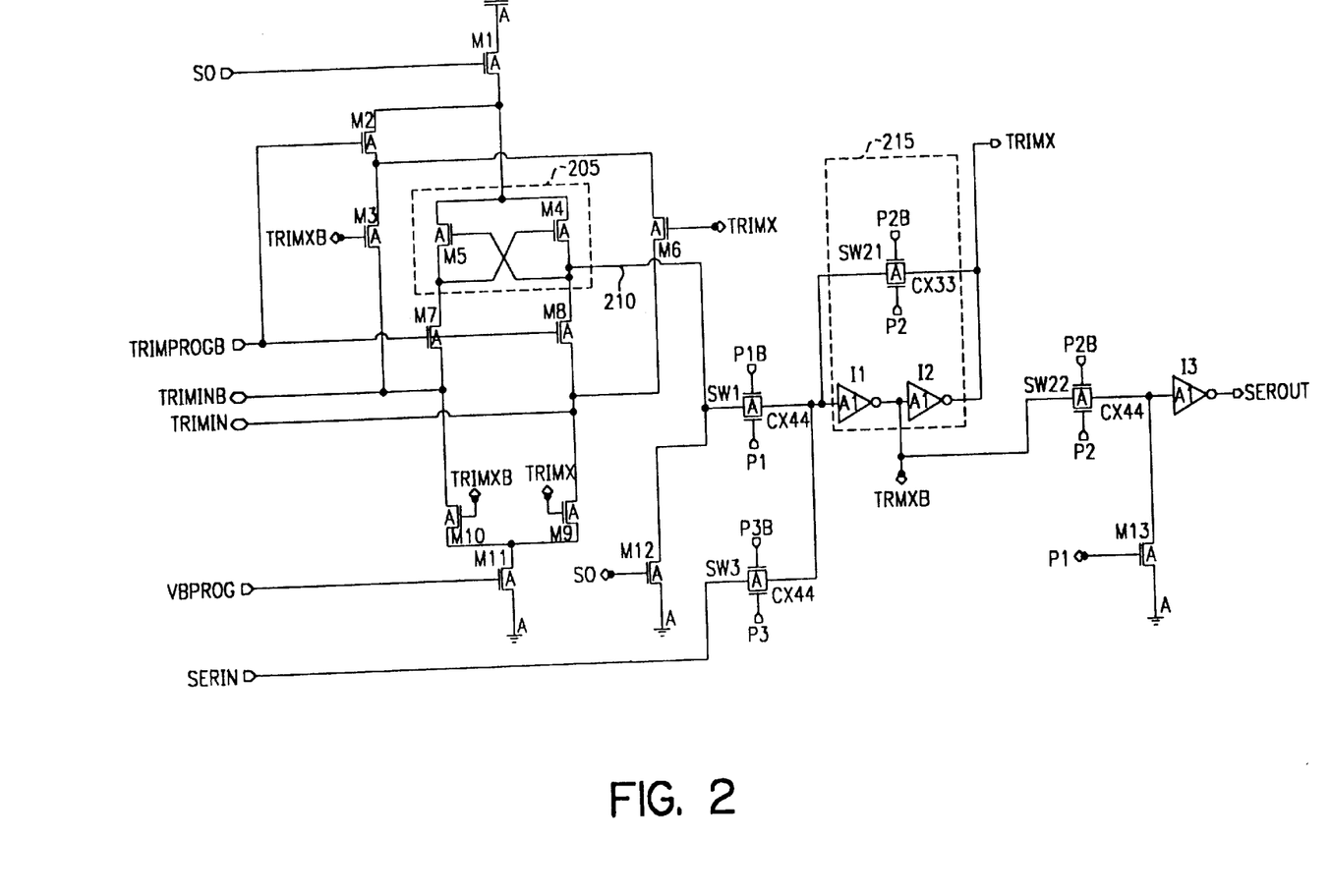
FIG. 2 illustrates a circuit diagram of a trimcell differential amplifier circuit of FIG. 1.

FIG. 2 illustrates a circuit diagram of a trimcell differential amplifier circuit 130 of FIG. 1. Referring to FIGS. 1 and 2, the trimcell differential amplifier circuit 130 includes a first latch 205 having devices M4 and M5. The devices M4 and M5 are gated by devices M8 and M7, respectively. The flash memory trimcells $125_1$ and $125_2$ are coupled to devices M7 and M8 of the first latch 205 by way of TRIMINB and TRIMIN terminals, respectively. The first latch 205 has an output 210 which is coupled to a bi-lateral switch SW1. In one embodiment, the bi-lateral switch SW1 includes a N-channel device and a P-channel device with their respective sources and drains coupled to each other. Signal P1 and its complement P1B are coupled to the gates of the N-channel and P-channel devices of the switch SW1, respectively. Signals P1B, P2B, and P3B are the complement of signals P1, P2, and P3 respectively.

The trimcell differential amplifier circuit further includes a second latch 215 which provides a trimbit output TRIMX. The second latch 215 is the combination of a switch SW21 and inverters I1 and I2 connected in parallel to the switch SW21. In addition, the trimcell differential amplifier circuit 130 includes a shift path which commences from the serial input terminal SERIN through switch SW3, latch 215, and switch SW22 and culminates at the serial output terminal SEROUT.

In the Read mode, the sources of the flash memory trimcells $125_1$ and $125_2$ are tied to ground and the gates of the flash memory trimcells $125_1$ and $125_2$ are selected. When high, the signal TRIMPROGB passes the drain currents of the trimcells $125_1$ and $125_2$ to the devices M5 and M4. Trimcells $125_1$ and $125_2$ are used to generate a differential current which is applied to and amplified by the trimcell differential amplifier circuit 130. In particular, one of the flash memory trimcells $125_1$ and $125_2$ is programmed and has a high threshold voltage, thus causing a small drain current. The other of the flash memory trimcells $125_1$ and $125_2$ is erased and has a low threshold voltage, thereby generating a high drain current. For example, if TRIMIN is high and TRIMINB is low (with-TRIMPROGB high), device M5 is off and device M4 is on which causes the output 210 and TRIMX to be high. On the other hand, if TRIMIN is low and TRIMINB is high, device M5 is on and device M4 is off, thus causing the output 210 and TRIMX to be low. Additionally, in the Read mode, signal P1 is high to turn on bi-lateral switch SW1, while signals P2 and P3 are low to turn off switches SW21 and SW3, respectively. The trimbit is provided at the trimbit output TRIMX.

In the Shift mode, signal P1 is low to turn off switch SW1 and disconnect the first latch 205 from the shift path. A trimbit is serially shifted in (e.g., for programming, reading, etc.) from the serial input terminal SERIN by enabling P3. Thereafter, P3 is disabled and P2 is enabled to store the trimbit in the second latch 215 and provide the trimbit at the serial output terminal SEROUT.

With the present invention, trimbits that have to be changed are shifted in serially on the serial input terminal SERIN of the trimcell differential amplifier circuit 130 and stored in the second latch 215. Without having to program the row of flash memory trimcells $125_1$–$125_P$, the new trimbit settings can be used to characterize the trimable parts in an integrated circuit or to fix defective columns and/or rows. Trimable parts in an integrated circuit include, but are not limited or restricted to, voltage references, precision oscillators, etc. An example of a trimable circuit is described in U.S. Pat. No. 5,243,239 by Khan et al., and assigned to the assignee of the present invention.

In the Programming mode, a trimbit is first stored in the second latch 215 (e.g., by serially shifting in the trimbit) and on the trimbit output TRIMX. The signal TRIMPROGB is low in the Programming mode to disconnect the first latch 205 from the trimcells $125_1$ and $125_2$. The trimbit output TRIMX is used to switch on the programming current for one of the two flash memory trimcells $125_1$ and $125_2$. The programming current is set by VBPROG. The drain of the flash memory trimcell that is not being programmed is pulled up high to the supply voltage. For example, if the trimbit output TRIMX is high, device M3 is on (with devices M1 and M2 on) and device M10 is off to pull the TRIMINB terminal and the drain of trimcell $125_1$ high. With TRIMX high, device M6 is off and device M9 is on to provide the programming current to the drain of trimcell $125_2$ through the TRIMIN terminal.

In the Erase mode, the common sources of the flash memory trimcells $125_1$ and $125_2$ are tied to ground while the gates are tied to VERASE. In one embodiment, VERASE is 15 Volts. Moreover, in the Erase mode or an optional Power Down mode, signal S0 is pulled high to disconnect the supply voltage (turn device M1 off) from the circuit. Signal S0 is also pulled high in an optional Test mode to set the trimbit output TRIMX to zero.

Table 1 illustrates the control signals of the trimcell differential amplifier circuit 130 in the various modes as described above.

TABLE 1

TRIMDA modes and control signal voltages

| Signal | Read mode | Program mode | Erase mode | Shift mode |
|---|---|---|---|---|
| TRIMPROGB | VCC | VSS | VCC | VCC |
| S0 | VSS | VSS | VCC | VSS |
| VBPROG | VSS | ~$V_T$ | VSS | VSS |
| P1 | VCC | VSS | VCC | VSS |
| P2 | VSS | VCC | VSS | clock |
| P3 | VSS | VSS | VSS | clockb |

Figure 3:
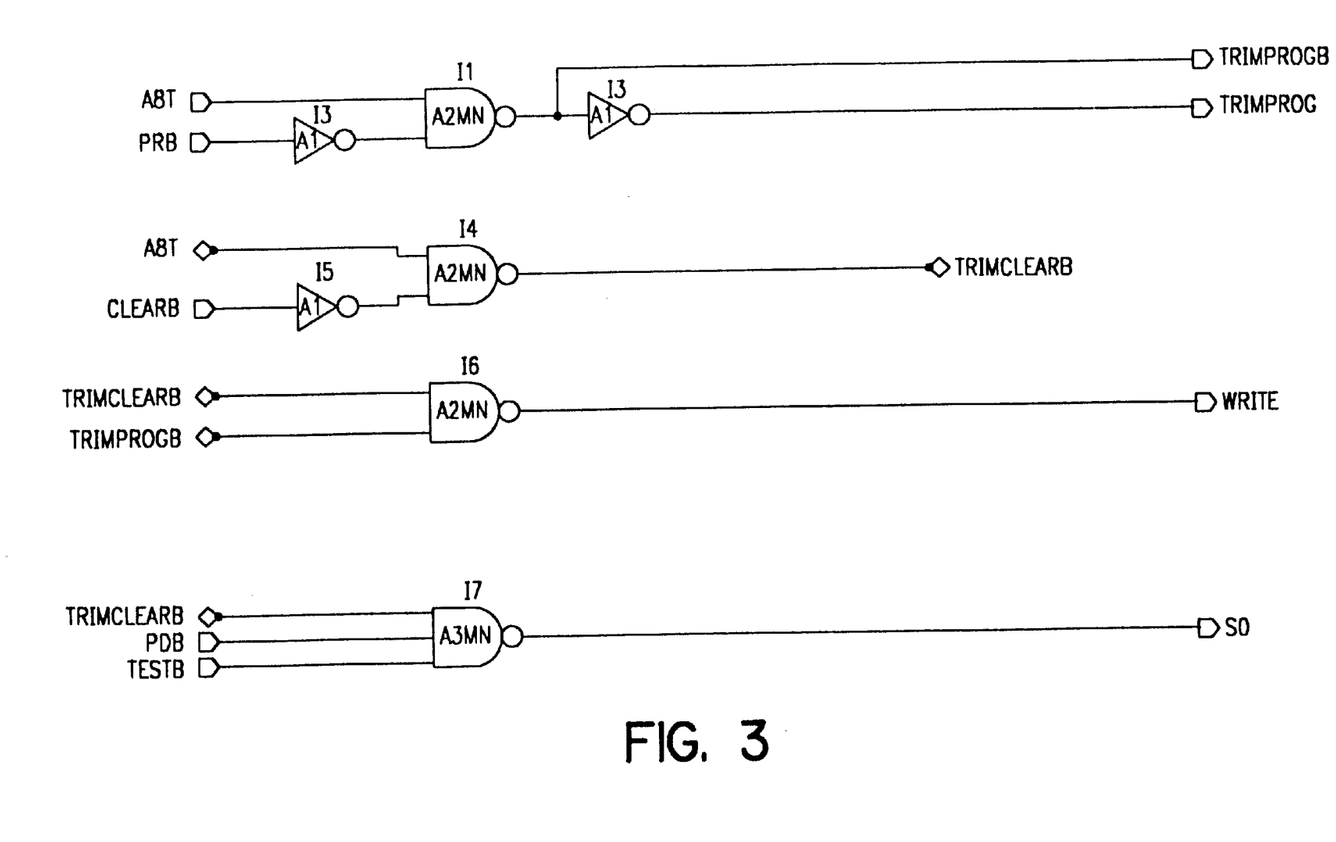
FIG. 3 illustrates a circuit diagram of the TRIMLOGIC circuit of FIG. 1.

$V_T$ = threshold voltage of an enhancement N-channel Mosfet
clock = clock signal voltage
clockb = inverse clock signal voltage
VSS = internal ground voltage
VCC = internal supply voltage FIG. 3 illustrates a circuit diagram of the TRIMLOGIC circuit 135 of FIG. 1. Referring to FIG. 3, the TRIMLOGIC circuit 135 includes control logic for the trimcell differential amplifier circuit 130 of FIG. 1. The input/output ("I/O") functions of the TRIMLOGIC circuit 135 can be described by the following equations:

$$TRMPROG = \overline{TRIMPROGB} = \overline{PRB} * A8T$$

$$WRITE = (\overline{CLEARB} * A8T) + (A8T * \overline{PRB})$$

$$S0 = (A8T * \overline{CLEARB}) + PDB + \overline{TESTB}$$

Signal A8T is a general signal which enables the Programming and Erase modes of the trimcell differential amplifier circuit 130. That is, signal A8T is set high in the Programming and Erase modes and set low for all other modes. Moreover, signal PRB is set high in the Read mode and set low in the Programming mode. Together they generate the signal TRMPROG. The signal WRITE is generated in the Programming mode or the Erase mode. Signal S0 is set high in the Erase mode, in a Test mode (TESTB signal), or when the integrated circuit is in the Power Down mode (PDB signal).

Figure 4:
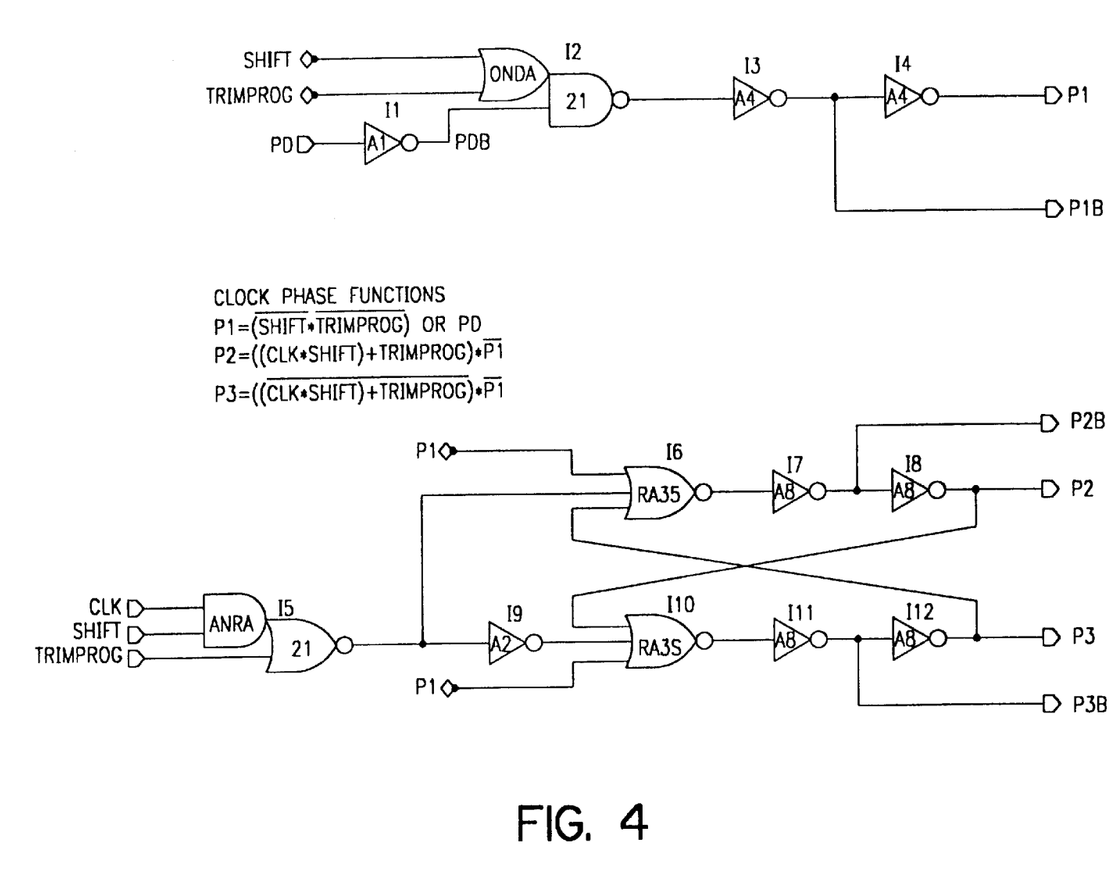
FIG. 4 illustrates a circuit diagram of the TRIMCLK circuit of FIG. 1.

FIG. 4 illustrates a circuit diagram of the TRIMCLK circuit 140 of FIG. 1. Referring to FIG. 4, the TRIMCLK circuit 140 provides three clock phases having signals P1, P2, P3 and their inverse signals P1B, P2B, and P3B. The signals in the three phases are used in the trimcell differential amplifier circuit 130. Clock phase P1 is used to pass a trimbit to the trimbit output TRIMX in the Read or Test mode. In all other modes signal P1 is set low. Clock phase P2 is used to store the trimbit in the second latch 215 of FIG. 2 and to provide the trimbit on the serial output terminal SEROUT. In the Test or Read modes, signal P2 is set low. In the Shift mode, signal P3 is used to shift in a trimbit from the serial input terminal SERIN. The relation between the clock phases and the inputs are described by the following equations:

$$P1 = (\overline{SHIFT} * \overline{TRIMPROG}) + PD$$

$$P2 = (CLK * SHIFT) + TRIMPROG) * \overline{P1}$$

$$P3 = (\overline{(CLK * SHIFT)} + TRIMPROG) * \overline{P1}$$

Figure 6:
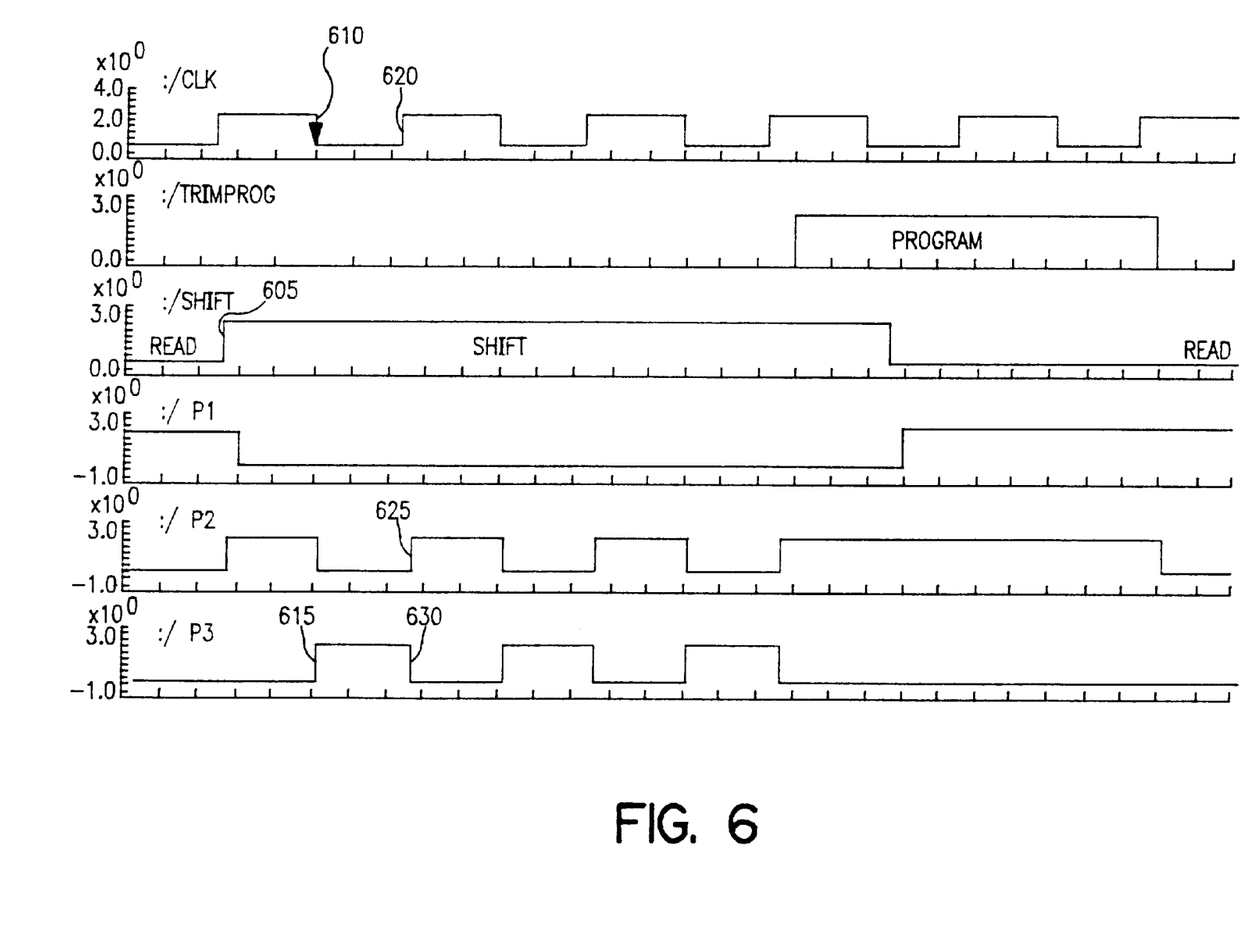
FIG. 6 is a timing diagram illustrating the relationship between various signals.

Clock phases P2 and P3 are generated by a non-overlapping clock generator, which is necessary for the shift action in the trimcell differential amplifier circuit 130. The relationship between the signal is shown in the timing diagram of FIG. 6. Referring to FIGS. 2 and 6, in the Shift mode, when the SHIFT signal goes high at time 605 and CLK goes low at time 610 (and TRIMPROG is low), the signal P3 goes high at time 615 and shifts in a trimbit on the serial input terminal SERIN. When CLK goes high again at time 620, signal P2 goes high at time 625 to provide the trimbit at the trimbit output TRIMX and also to shift out the trimbit on the serial output terminal SEROUT. Meanwhile when CLK goes high at time 620, signal P3 goes back low at 630 to disconnect the serial input terminal SERIN from the second latch 215 and the serial output terminal SEROUT.

Figure 5:
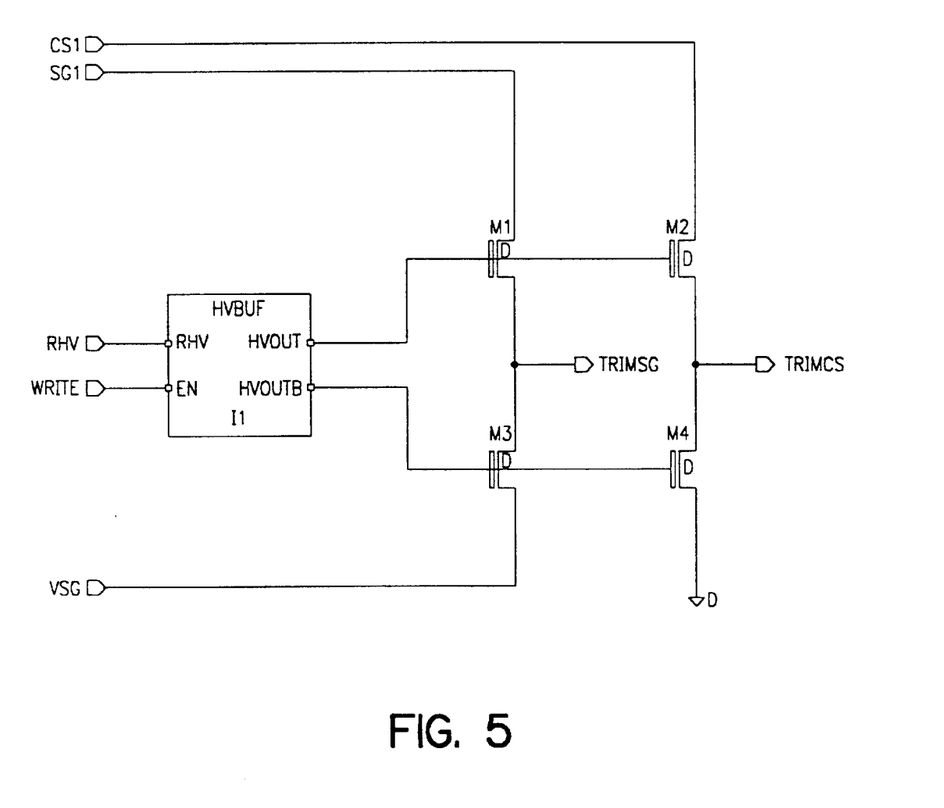
FIG. 5 illustrates a circuit diagram of the TRIMVSUP circuit of FIG. 1.

FIG. 5 illustrates a circuit diagram of the TRIMVSUP circuit 145 of FIG. 1. Referring to FIG. 5, the TRIMVSUP circuit 145 supplies the select gate voltage TRIMSG and the common source voltage TRIMCS to the row of flash memory trimcells $125_1$–$125_P$ in the Read and Programming modes.

In the Read mode, the signal WRITE is set low and the high voltage buffer HVBUF selects the high voltage devices M3 and M4. As a result, the signal VSG is passed to TRIMSG and TRIMCS is pulled low (ground). In the Programming or Erase modes, WRITE is set high and the high voltage buffer HVBUF turns on high voltage devices M1 and M2. As a result, the signal SG1 is passed to TRIMSG and the signal CS1 is passed to TRIMCS. Table 2 shows the TRIMVSUP output and control signal voltages for the various modes.

TABLE 2

TRIMVSUP output and control voltages

| Signal | Read mode | Programming mode | Erase mode | Shift mode |
|---|---|---|---|---|
| WRITE | VSS | VCC | VCC | VSS |
| TRIMSG | VSG | VSG | VERASE | VSG |
| TRIMCS | VSS | VCSPROG | VSS | VSS |

The voltage VSG is the select gate voltage, which is typically 2.3 V in Programming mode and 4.5 V in Read mode. VERASE is the Erase voltage, which is typically 15 V. VCSPROG is the common source programming voltage, with a typical value of 12 V.

Figure 7A:
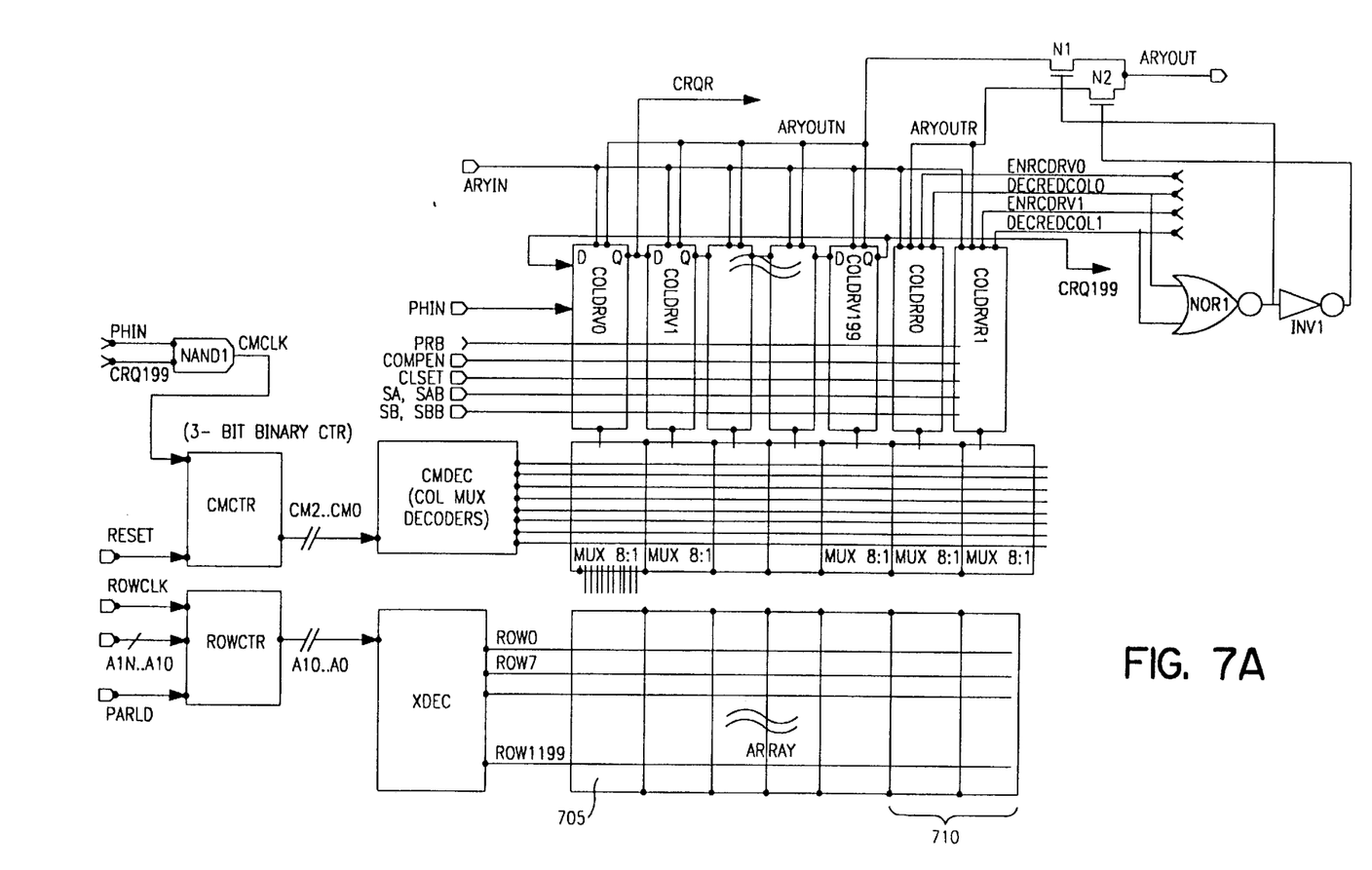
FIG. 7 is a block diagram illustrating a column redundancy circuit for a non-volatile memory suitable for use with the present invention.
Figure 7B:
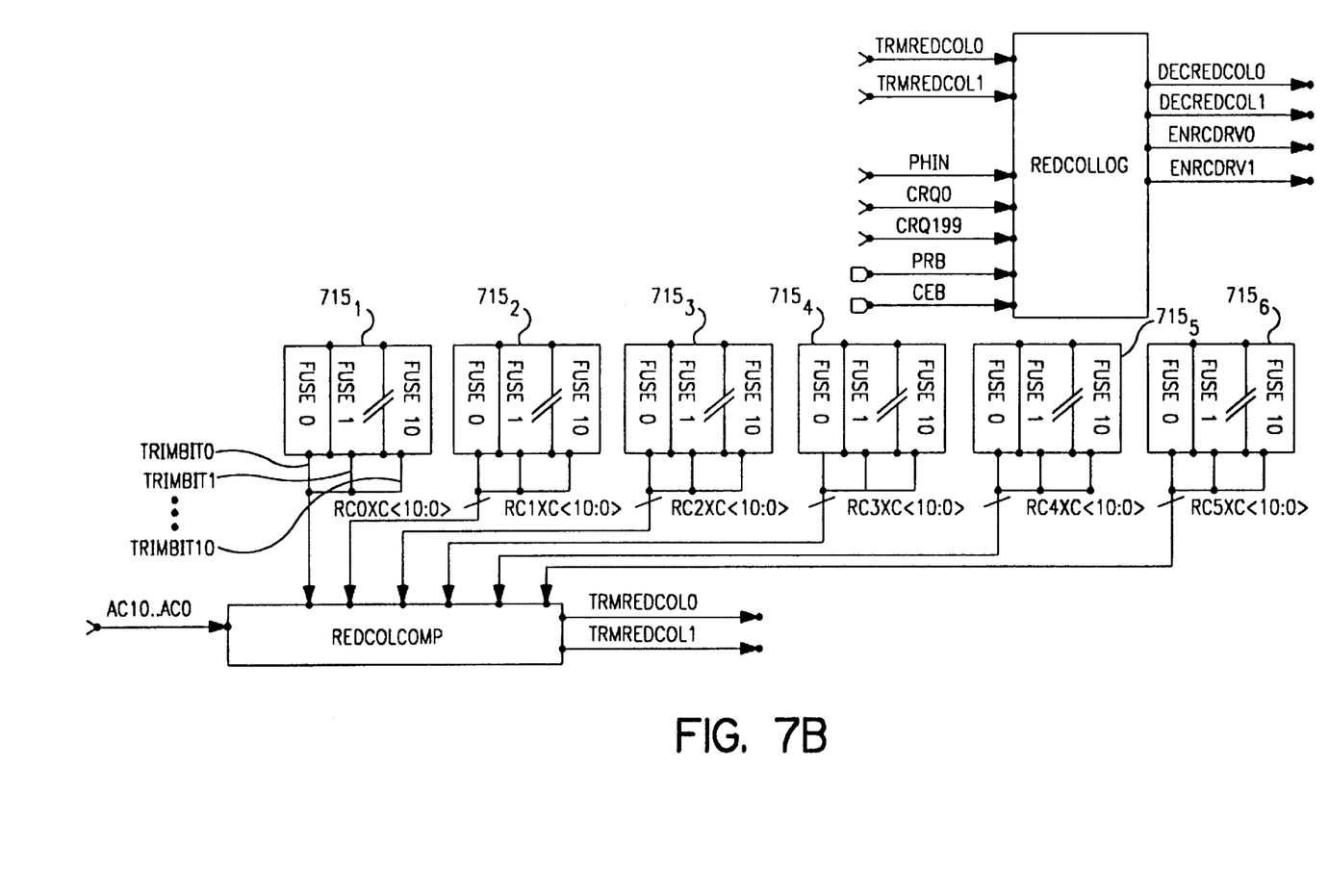

An application of the present invention is described in co-pending U.S. patent application entitled "Method and Apparatus of Column Redundancy for Non-volatile Analog and Multilevel Memory Integrated Circuits", by Hieu Van Tran and James Brennan, Jr., application Ser. No. 09/005,098, filed concurrently herewith and assigned to the assignee of the present invention. FIG. 7 is a block diagram illustrating a column redundancy circuit for a non-volatile memory suitable for use with the present invention. As shown in FIG. 7, a memory array includes a main array 705 and a column redundancy array 710, in this embodiment embedded at the right side of the main array 705, though the redundancy array could be placed anywhere in the overall memory array, as the redundancy columns are exactly the same as the main array columns.

In the embodiment shown in FIG. 7, the main array 705 comprises 1600 columns, organized in 200 groups of eight columns, each column being driven through a respective one of 200 column drivers COLDRV0 through COLDRV199, each column driver driving a respective one of the eight columns associated therewith through a respective one of the 8:1 MUXes coupled thereto. The redundancy array 710 comprises 16 columns, organized in 2 groups of eight columns. Like in the main array, each of the two columns of the redundancy array is driven through a respective one of 2 column drivers COLDRVRO and COLDRVR1, each column driver driving a respective one of the eight columns associated therewith through the 8:1 MUX coupled thereto.

The preferred embodiment of FIG. 7 is used in an analog sample storage and play-back system. Accordingly, the following discussion will assume an analog non-volatile memory application. An analog non-volatile memory cell of the preferred embodiment can typically store an analog sample with a resolution on the order of one part in 250 or better. The storage capacity of the embodiment of FIG. 7 for the stated array size is 240 seconds. This recording duration, divided by one over the audio sampling rate of 8 KHz, requires 240 seconds/125 $\mu$s=1.92M cells, where each cell is equivalent to 125 $\mu$s. While the array herein is divided into 1600 columns and 1200 rows to provide the 1.92M cells, other divisions, sample rates and recording times are of course possible.

The array can be externally accessed by row address only. Each row of the array is divided into 8 scans, each scan being equal to 25 ms or 200 cells. Twenty-five milliseconds is the audio resolution, in that an audio signal is sampled at 8 KHz, but 200 samples are stored in 200 cells at a time, so that audio samples are taken and stored, and played back, in time increments of the analog signal of 25 ms. The whole row can thus be programmed or read back in 8 scans. The column drivers therefore only drive 200 cells at the same time, so the number of column drivers are 200, as stated before. Thus the 8:1 MUXes are needed to connect the 200 column drivers to the 1600 columns.

Central to the embodiment of FIG. 7 are six sets of fuses $715_1$–$715_6$, each set having eleven fuses (FUSE0–FUSE10) with corresponding outputs TRIMBIT0–TRIMBIT10. Each fuse (FUSE0–FUSE10) of the six sets of fuses $715_1$–$715_6$ corresponds to a pair of flash memory trimcells (e.g., $125_1$ and $125_2$) and a trimcell differential amplifier circuit (e.g., $130_1$) of FIG. 1. Replacement of the bad columns in the main array 705 with columns of the redundancy array 710 is done at the time of factory production testing. First, any bad columns in the main array and redundancy array are identified and bad column addresses are programmed in one or more sets of fuses. Once the fuses are programmed, the bad columns in the main array 705 are replaced by good columns in the redundancy array 710 whenever the bad columns in the main array are addressed.

The redundancy column comparator REDCOLCOMP compares the column addresses programmed into the six sets of fuses $715_1$–$715_6$ with the current column address AC10..AC0 (which is internally generated), and on detecting an exact match, outputs signals to the column redundancy control logic REDCOLLOG which in turn outputs signals to control NOR gate NOR1 and inverter INV1 to make the redundancy memory cells active instead of the normal memory cells by turning on transistor N2 and turning off transistor N1. If there are more sets of fuses than bad columns then the unused sets of fuses are programmed to have an out of bounds address. An out of bounds address is an address that is above the addressable area in the main array 705 (i.e., 1200 rows). With eleven address lines, over two thousand rows can be addressed, thereby providing more than enough out of bounds addresses.

The row decoder XDEC is a typical binary decoder, and the row counter ROWCTR is a typical parallel load binary counter. The addresses into the row counter ROWCTR are loaded in parallel on occurrence of the parallel load signal PARLD and are incremented to the next row at the end of the last (eighth) scan for each row by the ROWCLK signal. The XDEC is a typical row decoder which accepts row address A10..A0 and does binary decoding to select any one row from ROW0 to ROW1199.

The column MUX counter CMCTR is a typical 3-bit binary counter which may be reset by the reset signal RESET. The column MUX decoder CMDEC is a typical binary decoder which accepts column MUX address bits CM2..CM0 and does a binary decoding to select one of the eight columns controlled by each column driver. The NAND gate NAND1 is used to provide the column MUX clock by ANDing sample clock PHIN and CRQ199, which, once CRQ199 goes high, indicates a count of 200 has been reached, i.e. the current scan is done and the next scan is to begin. The column MUX decoder CMDEC is the scan decoder, as each column MUX counter advance will advance the column MUXes to the next scan.

The present invention provides an advantage of serially loading the trimbits in a latch where they can be stored and used for characterization of the integrated circuit. Also, programming, erasing, and reading of the flash memory fuses is done by means of separate drivers. Therefore, a column and/or row redundancy scheme is allowed. The flash memory fuses are embedded in the array and thus match the flash memory cells in the array.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A trimbit circuit for flash memory integrated circuits, comprising:
    a row of memory trimcells divided into pairs of memory trimcells; and
    a plurality of circuits each coupled to the pairs of memory trimcells, each of said circuits to provide a trimbit as an output by way of a first path based on values programmed in a corresponding pair of memory trimcells, and each of said circuits having a latch to load in a trimbit by way of a second path for programming the corresponding pair of memory trimcells in parallel.

2. The trimbit circuit of claim 1 wherein the first path of each circuit comprises:

a second latch including an input coupled to said pair of memory trimcells and an output;

a switch coupled to the output of the second latch, the switch being enabled to provide the trimbit in a read mode and the switch being disabled in a programming mode to disconnect the first path from the trimbit output.

3. The trimbit circuit of claim 1 wherein the second path of each circuit comprises:

an input terminal;

a second switch coupled to the input terminal and the first latch, the second switch being disabled in the read mode to disconnect the input terminal from the first latch, and the second switch being enabled to load in a trimbit from the input terminal to the first latch in a shift mode.

4. The trimbit circuit of claim 1 further comprising an array of memory cells having a plurality of row and columns, the row of memory trimcells being part of the array of memory cells.

5. The trimbit circuit of claim 4 wherein the row of memory trimcells is located at the bottom of the array.

6. The trimbit circuit of claim 4 further comprising dummy row and columns of memory cells located between the array of memory cells and the row of memory trimcells to provide a barrier between the array of memory cells and the row of memory trimcells.

7. A fuse circuit, comprising:

first and second flash memory trimcells; and a trimbit circuit including a first latch coupled to the first and second flash memory trimcells, said first latch provides a differential output depending on threshold voltages of the first and second flash memory trimcells, a first switch coupled to the differential output, and a second latch coupled to the first switch, said second latch provides a trimbit output based on said differential output in a read mode.

8. The fuse circuit of claim 7 wherein the trimbit circuit includes:

an input terminal;

a second switch coupled to the input terminal and the second latch, said second switch being enabled in a shift mode to couple a trimbit on the input terminal to the second latch;

an output terminal coupled to the second latch to shift out the trimbit in the shift mode.

9. The fuse circuit of claim 8 further including circuitry to program one of the first and second flash memory trimcells depending on the value of the trimbit shifted in from the input terminal.

10. The fuse circuit of claim 9 wherein the second latch comprises:

a third switch; and a pair of inverters coupled in parallel with the third switch.

11. The fuse circuit of claim 10 wherein each of the first, second, and third switches comprises:

a first device of a first conductivity type having a gate, a source, and a drain;

a second device of a second conductivity type having a gate, a source, and a drain;

the sources and drains of the first and second devices being coupled to each other and a control signal being coupled to the gate of the first device and a complement of the control signal being coupled to the gate of the second device.

12. The fuse circuit of claim 7 wherein the first latch includes first and second devices of a first conductivity type each having a gate, a source, and a drain.

13. The fuse circuit of claim 12 wherein the first and second flash memory trimcells each include a gate, a source, and a drain, the drain of the first flash memory trimcell being coupled to the drain of the first device and to the gate of the second device, the drain of the second flash memory trimcell being coupled to the drain of the second device, the gate of the first device, and to the differential output.

* * * * *

UNITED STATES PATENT AND TRADEMARK OFFICE
CERTIFICATE OF CORRECTION

PATENT NO. : 5,933,370  
APPLICATION NO. : 09/005074  
DATED : August 3, 1999  
INVENTOR(S) : Holzman et al.

Page 1 of 1

It is certified that error appears in the above-identified patent and that said Letters Patent is hereby corrected as shown below:

On title page Item [54], Title, after "TRIMBIT CIRCUIT FOR FLASH MEMORY" please insert - - INTEGRATED CIRCUITS - -.

Signed and Sealed this

Fifteenth Day of August, 2006

JON W. DUDAS  
*Director of the United States Patent and Trademark Office*